United States Patent
Dede et al.

(10) Patent No.: US 8,243,451 B2
(45) Date of Patent: Aug. 14, 2012

(54) COOLING MEMBER FOR HEAT CONTAINING DEVICE

(75) Inventors: Ercan Mehmet Dede, Ann Arbor, MI (US); Brian Joseph Robert, St. Clair Shores, MI (US); Serdar H. Yonak, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 114 days.

(21) Appl. No.: 12/796,382

(22) Filed: Jun. 8, 2010

(65) Prior Publication Data
US 2011/0299244 A1 Dec. 8, 2011

(51) Int. Cl.
*H05K 7/20* (2006.01)
*H01L 23/34* (2006.01)

(52) U.S. Cl. ............... 361/702; 361/679.53; 361/689; 361/699; 361/703; 361/304; 361/718; 165/104.33; 165/185; 257/714; 363/141

(58) Field of Classification Search ............ 361/679.53–679.54, 689, 699, 702–704, 718; 165/104.33; 165/185; 257/714; 363/141
See application file for complete search history.

(56) References Cited

U.S. PATENT DOCUMENTS

| 3,592,260 | A | * | 7/1971 | Berger ..................... 165/121 |
| 5,606,201 | A | | 2/1997 | Lutz |
| 6,688,381 | B2 | | 2/2004 | Pence et al. |
| 7,117,928 | B2 | * | 10/2006 | Chen ........................ 165/80.3 |
| 7,250,674 | B2 | * | 7/2007 | Inoue ......................... 257/712 |
| 8,077,460 | B1 | * | 12/2011 | Dede et al. .................. 361/699 |
| 2010/0170657 | A1 | * | 7/2010 | Kaslusky .................... 165/80.3 |
| 2012/0063085 | A1 | * | 3/2012 | Dede .......................... 361/692 |
| 2012/0063091 | A1 | * | 3/2012 | Dede et al. .................. 361/699 |

OTHER PUBLICATIONS

Rocha; Tree-shaped vascular wall designs for localized intense cooling; International Journal of Heat and Mass Transfer 52; (2009); pp. 4535-4544.

* cited by examiner

*Primary Examiner* — Robert J Hoffberg
(74) *Attorney, Agent, or Firm* — Gifford, Krass, Sprinkle, Anderson & Citkowski, P.C.

(57) ABSTRACT

A cooling member for withdrawing heat from a heat containing device is disclosed. The cooling member can have a housing with a fluid inlet, a fluid outlet and a plurality of irregular-shaped fins located at least partially therewithin. In addition, a plurality of irregular-shaped and hierarchical branched fluid pathways can be located between the plurality of fins and the housing and/or the plurality of fins can be in physical contact with the heat containing device.

17 Claims, 5 Drawing Sheets

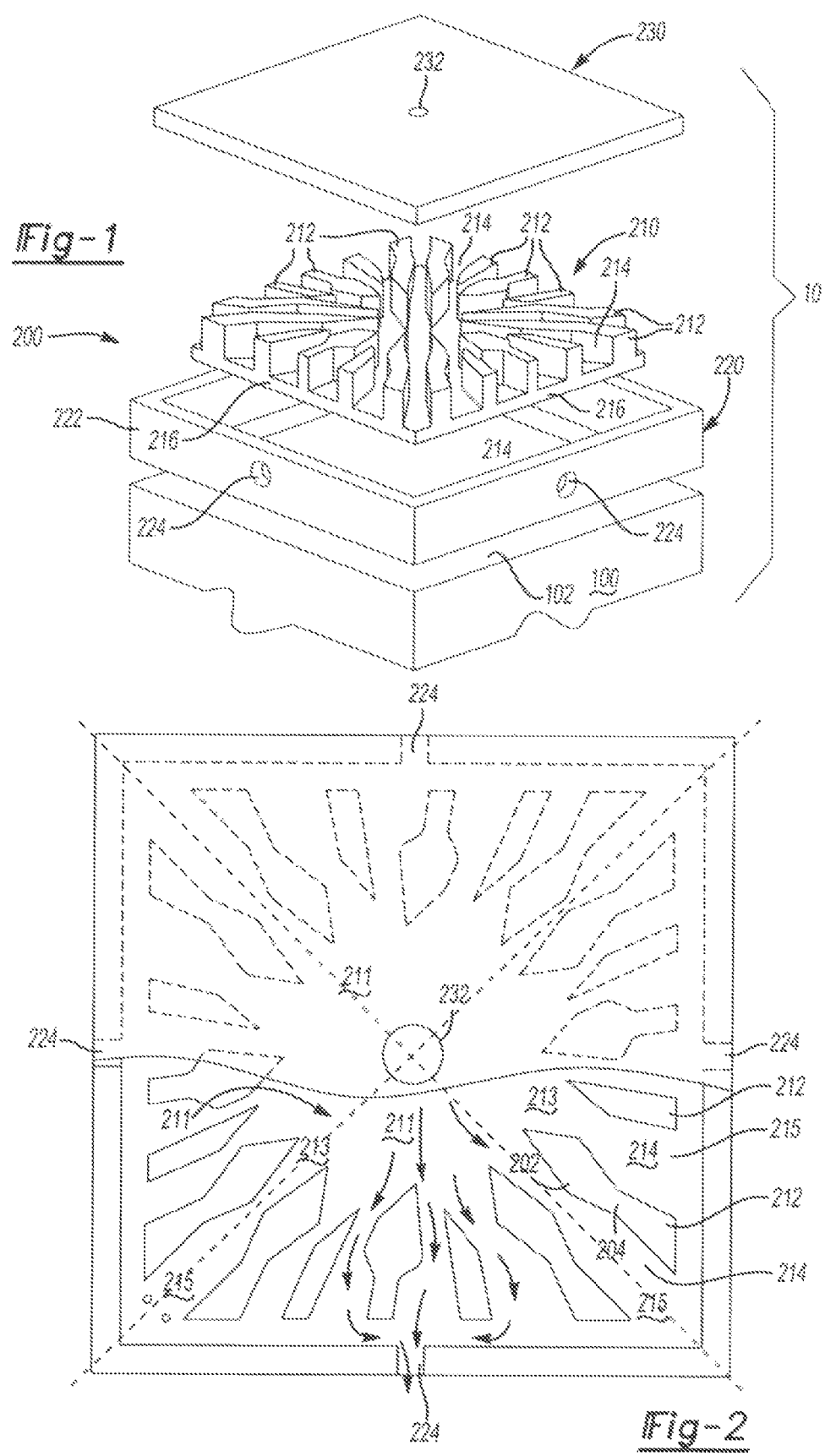

COOLING MEMBER FOR HEAT CONTAINING DEVICE

FIELD OF THE INVENTION

The present invention is related to a cooling member for withdrawing heat from a device containing heat. In particular, the present invention is directed to a cooling member that has a plurality of irregular-shaped and hierarchical branched fluid pathways.

BACKGROUND OF THE INVENTION

Heat is known to be generated by a variety of machines and devices such as electronic devices, electronic circuitry, internal combustion engines, etc. For such devices, heat is typically dissipated therefrom in order to improve reliability and prevent premature failure. Techniques, apparatus, etc., for heat dissipation can include heat sinks, fans for air cooling, liquid cooling, radiators, heat pipes, etc. In some instances, fluid can be forced through a cooling member that is in physical contact with and/or attached to the device in order to dissipate or remove heat. However, heretofore cooling members have not taken full advantage of the structure or topology of the cooling member such that maximum cooling of the heat containing device occurs in a cost effective manner. Therefore, a cooling member having a structure that provides for increased cooling for a heat containing device would be desirable.

SUMMARY OF THE INVENTION

A cooling member for withdrawing heat from a heat containing device is disclosed. The cooling member can have a housing with a fluid inlet, a fluid outlet and a plurality of irregular-shaped fins located at least partially therewithin. The housing and/or the plurality of fins can be in physical contact with the heat containing device such that heat from the device is conducted to the fins.

Between the plurality of irregular-shaped fins can be a plurality of irregular-shaped and hierarchical branched fluid pathways. In addition, a fluid can flow through the housing via the fluid inlet, plurality of irregular-shaped and hierarchical branched fluid pathways and fluid outlet, and thereby conduct or dissipate heat away from the plurality of fins and thus away from the heat containing device.

The plurality of irregular-shaped and hierarchical branched fluid pathways can each have a pathway inlet and a pathway outlet such that fluid flows into a pathway through one end exits the pathway through a different end. In the alternative, one or more of the plurality of irregular-shaped and hierarchical branched fluid pathways can be a closed-end fluid pathway with a pathway inlet but no pathway outlet.

The housing can have a first panel and a second panel spaced apart from the first panel, the plurality of irregular-shaped fins extending between the first panel and the second panel. As such, the plurality of irregular-shaped and hierarchical branched fluid pathways can be located between the first panel, second panel and plurality of irregular-shaped fins. The fluid inlet can be an opening through the first panel and the housing can have a fluid inlet region where fluid enters after passing through the fluid inlet and before passing or flowing through the plurality of irregular-shaped pathways. In addition, the plurality of irregular-shaped fins and/or pathways can extend outwardly from the fluid inlet region.

The plurality of irregular-shaped fins can have a shape such that each branch of the hierarchical branched fluid pathways has a non-linear sidewall. In some instances, each non-linear sidewall can have a convex portion and a concave portion when viewed from a single adjacent fluid pathway with the curvature of the convex portion and concave portion extending in a generally parallel or perpendicular direction relative to the flow of fluid through the pathway.

A heat producing device can further be included, the heat producing device illustratively including a microprocessor, a power handling semiconductor device (e.g. a free wheeling diode, a metal-oxide-semiconductor field-effect transistor, reverse conducting insulated gate bipolar transistor, etc.), a microcontroller, application-specific integrated circuit (ASIC), a digital signal processor (DSP), a field-programmable gate array (FPGA) and the like. The heat producing component can have a first side with a first cooling member attached thereto and a second side with a second cooling member attached thereto. In addition, a first substrate can be located between the first cooling member and the first side of the heat producing device and a second substrate can be located between the second cooling member and the second side of the heat producing device. In some instances, the first substrate and/or second substrate can be a dielectric with direct bonded aluminum or direct bonded copper.

BRIEF DESCRIPTION OF THE DRAWINGS

FIG. 1 is an exploded view of an embodiment of the present invention;
FIG. 2 is a top cutaway view of the embodiment shown in FIG. 1.

DETAILED DESCRIPTION OF THE INVENTION

Figure 3:
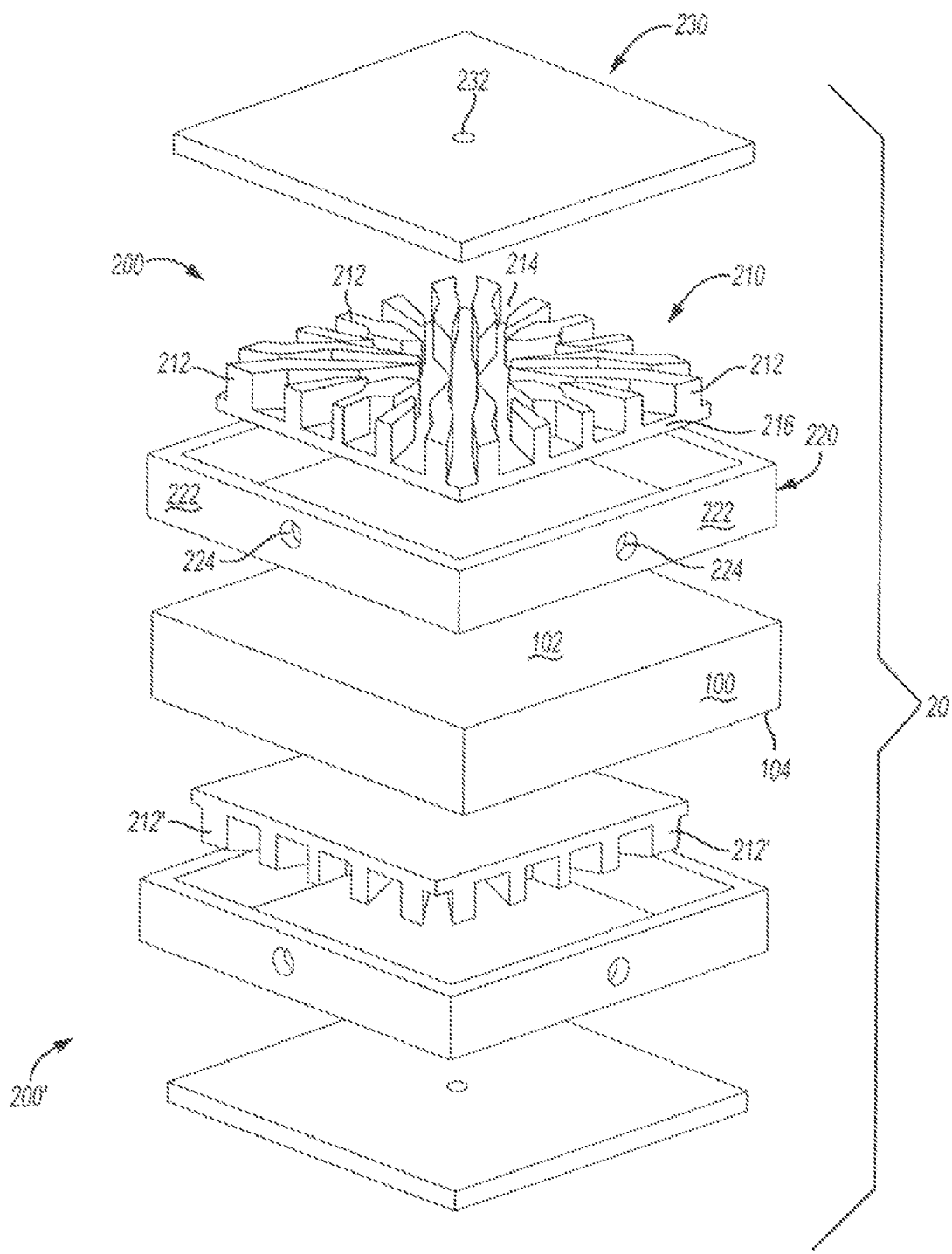
FIG. 3 is another embodiment of the present invention.

The present invention discloses a cooling member for withdrawing heat from a device containing heat. As such, the present invention has utility as a component in a motor vehicle.

The cooling member can have a housing with a fluid inlet and a fluid outlet. In addition, the housing can be in physical contact with and/or attached to the heat containing device. A plurality of irregular-shaped fins can be located at least partially within the housing and a plurality of irregular-shaped and hierarchical branched fluid pathways can be located between the irregular-shaped fins. The cooling member has a structure such that a cooling fluid can flow into the housing through the fluid inlet, further flow through the plurality of irregular-shaped and hierarchical branched fluid pathways, and then exit the housing through the fluid outlet. In this manner, heat from the heat containing device that is conducted to the plurality of irregular-shaped fins can be removed or dissipated by the fluid flowing through the cooling member.

The design and thus shape of the hierarchical branched fluid pathways can be derived through gradient-based optimization in order to obtain an optimal channel topology. Stated differently, a gradient-based multi-physics finite element technique or analysis can be used to obtain complex channel shapes that maximize heat transfer as a function of fluid flow and surface area of the pathways. In some instances, the gradient-based optimization can incorporate constructal theory to maximize heat transfer from the heat containing device. In addition, the gradient-based optimization can be a non-analytical solution to the problem of maximizing heat dissipation given a set of constraints such as cooling member material properties, fluid properties and the like.

The plurality of irregular-shaped and hierarchical branched fluid pathways can each have a pathway inlet and a pathway outlet with fluid flowing through the cooling member and entering a given pathway through a pathway inlet and exiting the pathway through a pathway outlet. In the alternative, one or more of the pathways can be a closed-end fluid pathway having a pathway inlet but no pathway outlet.

The housing can have a first panel and a second panel spaced apart from the first panel with the plurality of irregular-shaped fins extending between the first panel and the second panel. The fluid inlet can be an opening through the first panel and the housing can have a fluid inlet region into which fluid flows after passing through the fluid inlet of the first panel and from which fluid flows before entering the plurality of irregular-shaped and hierarchical branched pathways. It is appreciated that the plurality of irregular-shaped fins and the plurality of irregular-shaped and hierarchical branched pathways can extend outwardly from the fluid inlet region of the housing.

Each of the plurality of irregular-shaped fins can have a non-linear sidewall, the non-linear sidewall having a convex portion and a concave portion when viewed from a single adjacent fluid pathway. In addition, the curvature of the convex portion and the concave portion can extend in a generally parallel direction, or in the alternative, a generally perpendicular direction relative to the main flow of fluid through the pathway.

A heat producing device can be further included and be attached to the cooling member or vice-versa. In some instances, the heat producing device can have a first side with a first cooling member attached thereto, a second side with a second cooling member attached thereto, etc. The heat producing device can be an electronic device, an internal combustion engine, a nuclear reaction device, and the like.

An electronic device can illustratively include a microprocessor, a power handling semiconductor device (e.g. a free wheeling diode, a metal-oxide-semiconductor field-effect transistor, reverse conducting insulated gate bipolar transistor, etc.), a microcontroller, an application-specific integrated circuit (ASIC), a digital signal processor (DSP), a field-programmable gate array (FPGA) and the like. A substrate may or may not be present between the heat containing device and the cooling member. In some instances, the substrates can be a dielectric with direct bonded aluminum (DBA), direct bonded copper (DBC), etc.

The cooling member can be made from any material known to those skilled in the art, illustratively including metals, alloys, polymers, ceramics, and the like. In addition, the cooling member can be made using any process or technique known to those skilled in the art, illustratively including molding, injection molding, polymer injection molding, rapid prototype fabrication, machining, etc.

Turning now to the figures, an exploded view of a cooling member 200 with a heat containing device 100 is shown generally at reference numeral 10 in FIG. 1. The heat producing device 100 can have the cooling member 200 attached thereto and the cooling member 200 can have a cooling structure 210 that is located at least partially within a housing 220. In addition, the cooling structure 210 can have a plurality of irregular-shaped fins 212 with irregular-shaped pathways 214 therebetween and a substrate 216 attached to a surface 102 of the heat producing device 100. In some instances, a dielectric with DBA or DBC can be located between the heat producing device 100 and the cooling member 200 and/or irregular-shaped fins 212. In the alternative, a dielectric cooling fluid can be used without a dielectric located between the heat producing device 100 and the cooling member 200 and/or irregular-shaped fins 212.

As shown in the figure, the plurality of irregular-shaped fins 212 can be attached to and may or may not be integral with the substrate 216. In the alternative, the plurality of irregular-shaped fins 212 can be attached directly to the surface 102 of the heat producing device 100.

The housing 220 can have one or more sidewalls 222 with an optional fluid outlet 224 therethrough. Encapsulating the cooling structure 210 within the housing 220 can be a plate 230 that may or may not have a fluid inlet 232 therethrough.

Turning now to FIG. 2, a top cutaway view of the embodiment shown in FIG. 1 is shown. As shown in this figure, the plurality of irregular-shaped pathways 214 can have a pathway inlet 213 and a pathway outlet 215. As also shown by the arrows in the figure, fluid can enter the housing 220 through the fluid inlet 232, pass through a fluid inlet region 211, enter an irregular-shaped pathway 214 through the pathway inlet 213, exit the pathway through the pathway outlet 215, and thereafter pass through the fluid outlet 224. In this manner, fluid passing through the cooling element 200 can withdraw or dissipate heat from the plurality of irregular-shaped fins, the irregular-shaped fins having heat that has been conducted thereto from the heat containing device 100. It is appreciated from the figure that the irregular-shaped pathway 214 has an irregular or non-uniform width that increases and then decreases between the inlet 213 and outlet 215.

Turning now to FIG. 3, an embodiment 20 illustrates the heat containing device 100 having a first side 102 and a second side 104. The first side 102 can have a first cooling member 200 attached thereto and the second side 104 can have a second cooling member 200' attached thereto. The second cooling member 200' may or may not be generally identical to the first cooling member 200 based on the cooling requirements of the second side 104 relative to the first side 102. In this manner, the heat producing device 100 can have a double-sided cooling structure attached thereto, bonded thereto, integrally fabricated therewith, and the like.

Similar to the embodiment 10 discussed above, a dielectric with DBA or DBC can be located between the heat producing device 100 and the cooling member 200, the cooling member 200', the irregular-shaped fins 212 and/or the irregular-shaped fins 212'. In the alternative, a dielectric cooling fluid can be used without a dielectric located between the heat producing device 100 and the cooling member 200, the cooling member 200', the irregular-shaped fins 212 and/or the irregular-shaped fins 212'.

Figure 4:
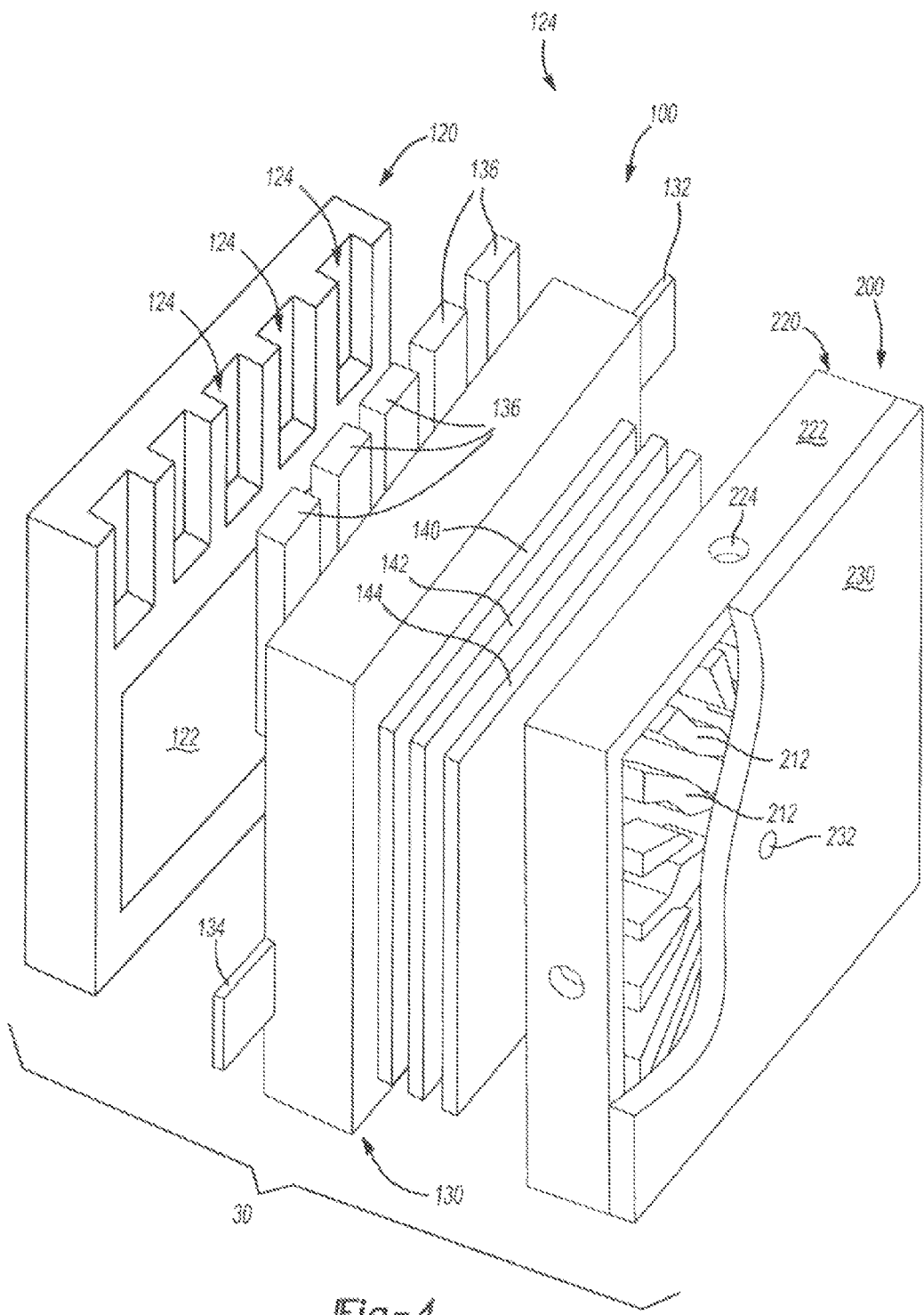
FIG. 4 is another embodiment of the present invention.

Turning now to FIG. 4, an embodiment 30 is shown where the heat containing device 100 is illustrated as an electronic device. For example and for illustrative purposes only, the heat producing device 100 can be an RC-IGBT. The device 100 can have a substrate 120 with device active region 122 and one or more sensor and/or control terminals 124. In addition, a substrate 130 can be attached to the substrate 120 and/or active region 122 and have a lead 132 to a motor and/or generator, a lead 134 to a battery, and one or more leads 136 to a gate/driver/controller. Attached to at least one side of the device 100 can be a cooling member 200 as described above. In the alternative, a layer or panel of DBA or DBC 140, a dielectric layer or panel 142 and/or a second layer or panel of DBA or DBC 144 can be located between the substrate 130 and the cooling member 200 and/or irregular-shaped fins 212. In this manner, an electronic power device can be cooled using a cooling member designed and fabricated according to gradient-based optimization.

Figure 5:
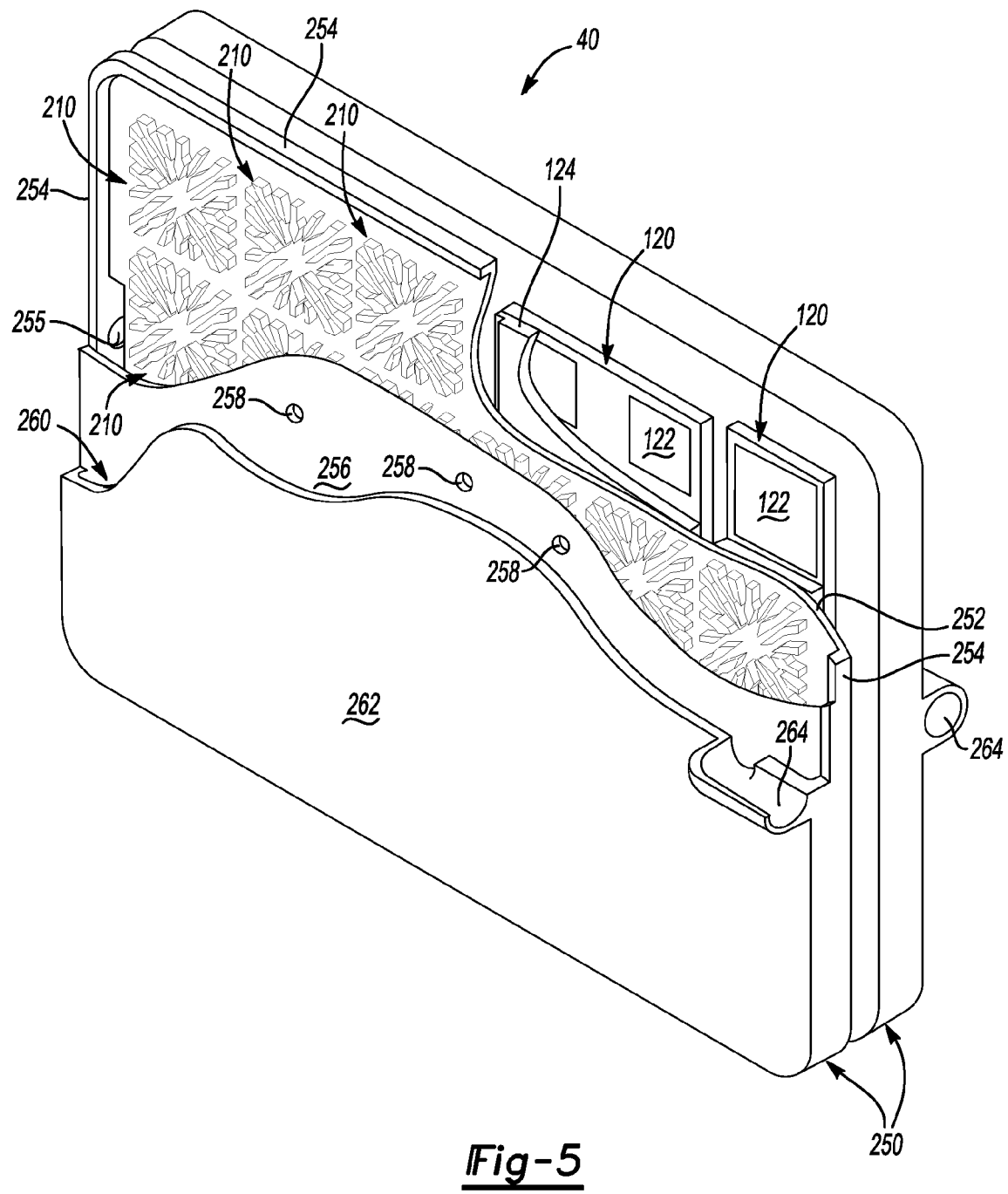
FIG. 5 is another embodiment of the present invention.

Referring now to FIG. 5, a plurality of power devices 120 are shown assembled in a compact unit 40. Adjacent to the device active regions 122 can be a substrate 124. It is appreciated that the substrate 124 can be a direct bonded aluminum (DBA) and/or a direct bonded copper (DBC) substrate. In the alternative, the substrate 124 can include or incorporate three layers—a first DBA or DBC layer, a dielectric layer and a second DBA or DBC layer as described above for FIG. 4. Adjacent to the substrate 124 can be a substrate or base plate 252 of a cooling member 250. The cooling member 250 can have a plurality of cooling structures 210 attached to and/or integral with the base plate 252. In addition, a sidewall 254 in combination with the base plate 252 and a cover plate 256 can provide a housing for the plurality of cooling structures 210. The cover plate 256 can have a plurality of fluid inlets 258 that afford for a fluid to enter and pass through the cooling structures 210.

The cooling member 250 can also have an outer plate 262 that can provide a fluid container 260. The fluid container 260 can have a fluid inlet 264 that affords for a cooling fluid to enter the fluid container 260, pass or flow through the fluid inlets 258, pass or flow through the cooling structures 210 and exit through a fluid outlet 255. In this manner, a plurality of electronic power devices 120 assembled as part of an electronic package and/or circuit can be effectively cooled using a cooling member 250 having a plurality of cooling structures 210. It is appreciated that a generally identical cooling member 250 can be placed on an opposite side of the plurality of power devices 120 and thereby provide a double-sided cooling structure bonded to and/or integrally fabricated with power module or device substrates.

Figure 6:
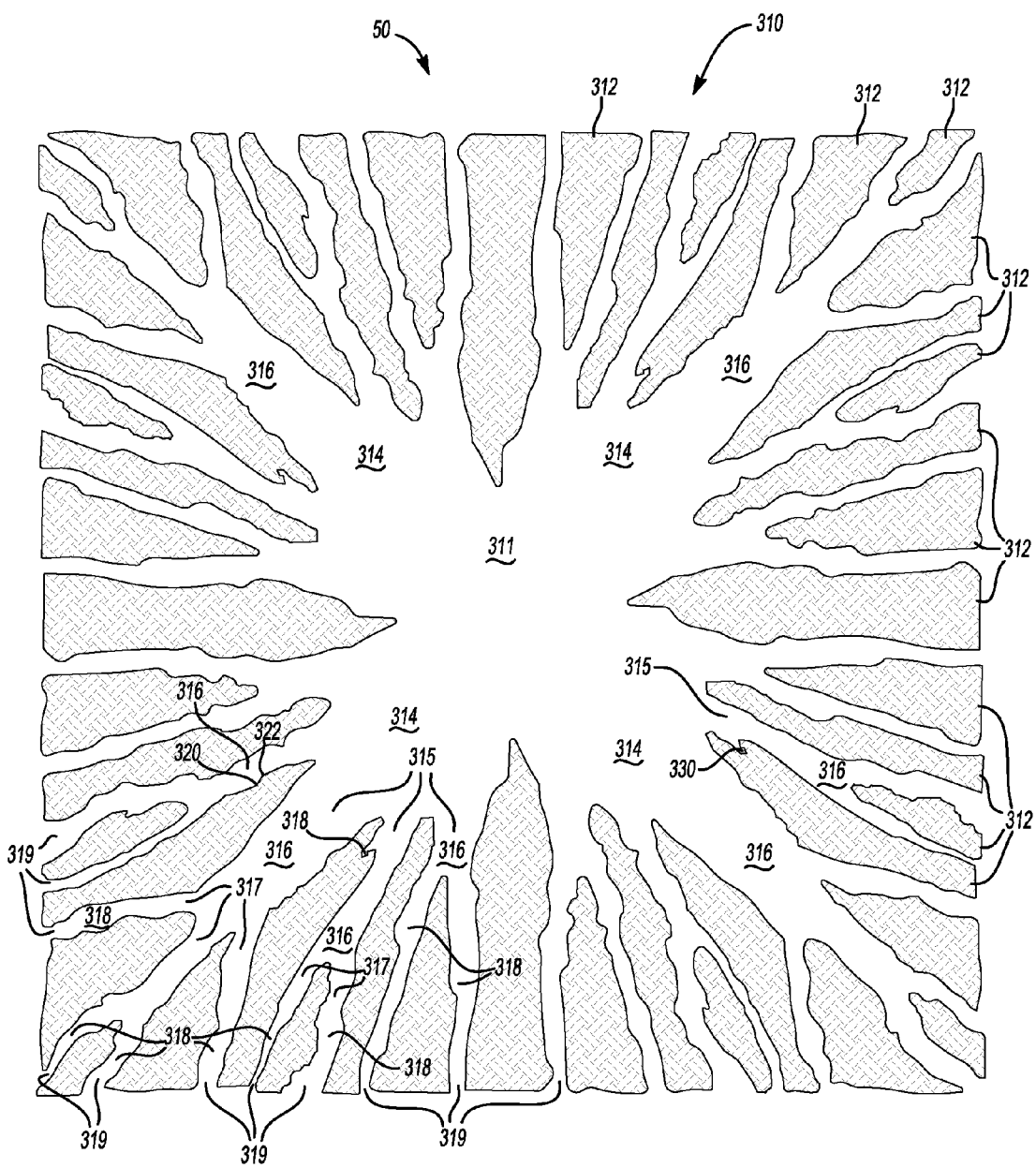
FIG. 6 is another embodiment of the present invention.

Turning now to FIG. 6, another embodiment 50 of a cooling structure 310 is shown with a plurality of irregular-shaped fins 312 and irregular-shaped and hierarchical branched pathways 314, 316, 318 therebetween. It is appreciated that FIG. 6 provides a top view of the cooling structure 310. The cooling structure 310 can have an inlet fluid region 311 into which fluid flows before passing or flowing through a first irregular-shaped fluid pathway 314. The first pathway 314 can have a pathway outlet 315 and the outlet 315 can likewise serve as the pathway inlet for the second branched pathway 316. In addition, the second fluid pathway 316 can have a pathway outlet 317 which can likewise serve as the pathway inlet for the third pathway 318. And finally, the pathway 318 can have a pathway outlet 319 which affords for fluid passing through the pathway 318 to exit through a fluid outlet such as 255 shown in FIG. 5. It is appreciated that additional hierarchical branched pathways can be provided and fall within the scope of the present invention.

As shown in FIG. 6, the fins 312 and the pathways 314, 316 and 318 are irregular-shaped and the pathways are hierarchical branched. In addition, each branched pathway has a non-linear sidewall. In some instances, a sidewall can have a concave portion and a convex portion when viewed from a single adjacent pathway. For example and for illustrative purposes only, a concave portion 320 and a convex portion 322 are shown in the figure. It is appreciated that a concave portion and a convex portion may or may not be present in each branched pathway.

In some instances, the cooling structure 310 can have a closed-end pathway as illustrated by reference numeral 330 shown in the figure. It is appreciated that a closed-end pathway has a pathway inlet but does not have a pathway outlet. It is further appreciated that such a pathway can be the result of topological optimization arrived at through gradient-based optimization processing and/or techniques. In this manner, a cooling structure 310 can afford for optimum dissipation of heat from an adjacent heat containing device. In addition, such a cooling structure can attach to one side, two sides, three sides, etc., of a heat containing device. Furthermore, it is appreciated from FIGS. 1-3, 5 and 6 that the cooling member with the irregular-shaped pathways can have a two-fold symmetry, and in some instances, can have a four-fold symmetry.

The invention is not restricted to the illustrative examples or embodiments described above. The examples or embodiments are not intended as limitations on the scope of the invention. Methods, processes, apparatus, compositions, and the like described herein are exemplary and not intended as limitations on the scope of the invention. Changes therein and other uses will occur to those skilled in the art. The scope of the invention is thus defined by the scope of the claims.

We claim:

1. A cooling member for withdrawing heat from a device containing heat, said cooling member comprising:
a housing having a central fluid inlet and a radially spaced fluid outlet, said housing in physical contact with the device;
a plurality of irregular-shaped fins located at least partially within said housing, said plurality of irregular-shaped fins surrounding and extending radially from said central fluid inlet: and
a plurality of irregular-shaped and hierarchical branched fluid pathways between said plurality of irregular-shaped fins, said plurality of irregular-shaped and hierarchical branched fluid pathways having a pathway inlet and a pathway outlet with at least one of said irregular-shaped and hierarchical branched fluid pathways having a non-uniform width that decreases and then increases between said pathway inlet and said pathway outlet, said housing and plurality of irregular-shaped fins operable for a fluid to flow through said central fluid inlet, flow through said plurality of irregular-shaped and hierarchical branched fluid pathways, exit through said radially spaced fluid outlet and withdraw the heat: from the device.

2. The cooling member of claim 1, wherein said cooling member with said plurality of irregular-shaped and hierarchical branched fluid pathways has a two-fold symmetry.

3. The cooling member of claim 2, wherein said cooling member with said plurality of irregular-shaped and hierarchical branched fluid pathways has a four-fold symmetry.

4. The cooling member of claim 1, wherein said housing has a first panel and a second panel spaced apart from said first panel, said plurality of irregular-shaped fins extending between said first panel and said second panel.

5. The cooling member of claim 4, wherein said central fluid inlet is an opening through said first panel.

6. The cooling member of claim 5, wherein said plurality of irregular-shaped fins has a fluid inlet region, said plurality of irregular-shaped fins extending outwardly from said fluid inlet region.

7. The cooling member of claim 6, wherein each of said plurality of irregular-shaped fins has a non-linear sidewall.

8. The cooling member of claim 7, wherein the each of said plurality of irregular-shaped fins has a convex portion and a concave portion when viewed from a single adjacent fluid pathway of said plurality of irregular-shaped and hierarchical branched fluid pathways.

9. A heat producing device with a cooling member comprising:
a heat producing component having a first side and a second side;

a first cooling member attached to said first side of said heat producing component and a second cooling member attached to said second side of said heat producing component;

each of said first cooling member and second cooling member having:

a housing having a fluid inlet and a fluid outlet;

a plurality of irregular-shaped fins located at least partially within said housing;

a plurality of irregular-shaped and hierarchical branched fluid pathways between said plurality of irregular-shaped fins, said plurality of irregular-shaped and hierarchical branched fluid pathways having a pathway inlet and a pathway outlet with at least one of said irregular-shaped and hierarchical branched fluid pathways having a non-uniform width that decreases and then increases between said pathway inlet and said pathway outlet, the each of said first cooling member and second cooling member with said plurality of irregular-shaped and hierarchical branched fluid pathways having a two-fold symmetry; and a fluid flowing through said fluid inlet, through said plurality of irregular-shaped and hierarchical branched fluid pathways, through said fluid outlet and withdrawing heat from said heat producing component.

10. The heat producing device with the cooling member of claim 9, wherein the each of said first cooling member and second cooling members with said plurality of irregular-shaped and hierarchical branched fluid pathways having a four-fold symmetry.

11. The heat producing device with the cooling member of claim 10, further comprising a closed-end fluid pathway extending from said pathway inlet to said pathway outlet, wherein said pathway outlet having a closed-end.

12. The heat producing device with the cooling member of claim 9, wherein said housing has a first panel and a second panel spaced apart from said first e panel, said plurality of irregular-shaped fins extending between said first panel and said second panel.

13. The heat producing device with the cooling member of claim 12, wherein said fluid inlet is an opening through said first panel.

14. The heat producing device with the cooling member of claim 9, wherein said plurality of irregular-shaped fins has a fluid inlet region, said plurality of irregular-shaped fins extending outwardly from said fluid inlet region.

15. The heat producing device with the cooling member of claim 9, further comprising a first substrate between said first cooling member and said first side of said heat producing component and a second substrate between said second cooling member and said second side of said heat producing component.

16. The heat producing device with the cooling member of claim 9, wherein said heat producing component is an electronic device selected from the group consisting of a microprocessor, a power handling semiconductor device, a microcontroller, an application-specific integrated circuit (ASIC), a digital signal processor (DSP), a field-programmable gate array (FPGA), and combinations thereof.

17. The heat producing device with the cooling member of claim 9, wherein said heat producing component is a reverse conducting insulated gate bipolar transistor (RC-IGBT).

* * * * *